United States Patent
Aramaki et al.

(10) Patent No.: US 8,123,972 B2
(45) Date of Patent: Feb. 28, 2012

(54) SHEET-LIKE SOFT-MAGNETIC MATERIAL AND PRODUCTION METHOD THEREOF

(75) Inventors: Keisuke Aramaki, Tochigi (JP); Junichiro Sugita, Tochigi (JP); Morio Sekiguchi, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 387 days.

(21) Appl. No.: 12/311,248

(22) PCT Filed: Oct. 22, 2007

(86) PCT No.: PCT/JP2007/070566
§ 371 (c)(1), (2), (4) Date: Mar. 24, 2009

(87) PCT Pub. No.: WO2008/053737
PCT Pub. Date: May 8, 2008

(65) Prior Publication Data
US 2010/0001226 A1 Jan. 7, 2010

(30) Foreign Application Priority Data
Oct. 31, 2006 (JP) ................. 2006-295472

(51) Int. Cl.
*C04B 35/04* (2006.01)
*C04B 35/64* (2006.01)
*H01F 1/00* (2006.01)
*H01F 1/26* (2006.01)
*H01F 1/04* (2006.01)
*H01F 1/14* (2006.01)
*B22F 3/00* (2006.01)

(52) U.S. Cl. ............... 252/62.54; 252/62.55; 524/785
(58) Field of Classification Search .... 252/62.53–62.55; 524/785
See application file for complete search history.

(56) References Cited

U.S. PATENT DOCUMENTS

| 4,783,370 A | * | 11/1988 | Chernega et al. | 428/425.9 |
| 7,561,114 B2 | | 7/2009 | Maezawa et al. | |
| 2008/0054225 A1 | * | 3/2008 | Watanabe et al. | 252/500 |
| 2010/0264357 A1 | * | 10/2010 | Aramaki et al. | 252/62.54 |

FOREIGN PATENT DOCUMENTS

| JP | A-07-022771 | 1/1995 |
| JP | A-2000-101283 | 4/2000 |
| JP | A-2000-101284 | 4/2000 |
| JP | A-2000-243615 | 9/2000 |
| JP | A-2003-229694 | 8/2003 |
| JP | A-2004-140322 | 5/2004 |
| JP | A-2006-073949 | 3/2006 |
| JP | A-2006-128649 | 5/2006 |
| JP | A-2006-202266 | 8/2006 |
| WO | WO 2006/059771 A1 | 6/2006 |

OTHER PUBLICATIONS

Japanese Office Action dated Sep. 29, 2010 issued in Japanese Patent Application No. 2007-274123 (with translation).

* cited by examiner

*Primary Examiner* — Carol M Koslow
*Assistant Examiner* — Matthew Hoban
(74) *Attorney, Agent, or Firm* — Oliff & Berridge, PLC

(57) ABSTRACT

The present invention is to impart, to a sheet-like soft magnetic material, a configuration in which sheet thickness change is suppressed and in which fluctuation in magnetic permeability is small even under a high-temperature or a high-temperature, high-humidity environment, even when a plurality of thin curable soft magnetic sheets produced by a coating method are laminated. The sheet-like soft magnetic material is formed from a soft magnetic composition which is formed by mixing at least a flat soft magnetic powder, an acrylic rubber, an epoxy resin, a curing agent for the epoxy resin, and a solvent. The flat soft magnetic powder is arranged in an in-plane direction of the sheet-like soft magnetic material. An acrylic rubber having a glycidyl group is used for the acrylic rubber. The weight ratio of the flat soft magnetic powder with respect to the total amount of the acrylic rubber, the epoxy resin, and the curing agent for the epoxy resin is 3.7 to 5.8.

14 Claims, No Drawings

SHEET-LIKE SOFT-MAGNETIC MATERIAL AND PRODUCTION METHOD THEREOF

TECHNICAL FIELD

The present invention relates to a sheet-like soft magnetic material having characteristics of excellent magnetic properties and a small thickness change, and a production method thereof.

BACKGROUND ART

Production of the soft magnetic sheets used in various electronic devices is usually carried out by a kneading and rolling method. In such a method, a flat soft magnetic powder, a rubber, and a binder such as chlorinated polyethylene are kneaded in certain proportions by a kneader. The obtained kneaded mixture is rolled to a certain thickness with an apparatus such as a calendar roll. The binder may then optionally be heated to cause crosslinking, whereby a single-layer soft magnetic sheet is obtained. This method has the advantages that the soft magnetic powder can be filled to a high density, the soft magnetic powder can be oriented in an in-plane direction by the rolling, and adjustment of the sheet thickness is easy.

However, in the case of a kneading and rolling method, since strain occurs in the soft magnetic powder during the kneading, the magnetic properties of the soft magnetic powder itself deteriorate, so that there is the problem that the magnetic permeability of the soft magnetic sheet cannot be increased. Furthermore, the sheet thickness becomes thicker under a high temperature or high-temperature, high humidity environment, so that there is the problem that magnetic permeability decreases.

Therefore, instead of a kneading and rolling method, soft magnetic sheets may be produced by a coating method in which strain does not easily occur in the soft magnetic powder (Patent Document 1). In this method, a liquid composition for forming a soft magnetic sheet composed of a flat soft magnetic powder, a rubber, a resin, and a solvent, is applied to a release substrate. Then, by drying the liquid composition with which the release substrate has been coated, a soft magnetic sheet is obtained which has a small sheet thickness change even under a high temperature or high-temperature, high humidity environment.

[Patent Document 1] Japanese Patent Application Laid-Open No. 2000-243615

Disclosure of the Invention

Problems to be Solved by the Invention

However, while the coating method is suited for cases of producing a soft magnetic sheet with a relatively thin sheet thickness, it is not suited for producing a relatively thick soft magnetic sheet. This is because when thickly coating, unevenness in the coating thickness tends to occur, and also drying is difficult. Thus, the present inventors tried to produce a laminate-type sheet-like soft magnetic material by blending a curable resin and a curing agent thereof with a liquid composition for forming a soft magnetic sheet, producing a curable thin soft magnetic sheet by a coating method, and compressing a plurality of the produced sheets while curing them. However, for a laminate-type soft magnetic sheet produced by laminating thin soft magnetic sheets produced by a coating method, although the sheet thickness change of the individual thin soft magnetic sheets is small, like to the relatively-thick single-layer soft magnetic sheet produced by the kneading and rolling method, the sheet thickness becomes thicker under a high temperature or high-temperature, high humidity environment, so that there is the problem that magnetic permeability decreases.

The present invention is directed to resolving the above-described problems in the conventional art. It is an object of the present invention to impart, to a sheet-like soft magnetic material, a configuration in which sheet thickness change is suppressed and in which fluctuation in magnetic permeability is small even under a high-temperature or a high-temperature, high-humidity environment, even when a plurality of thin curable soft magnetic sheets produced by a coating method are laminated.

Means for Solving the Problems

The present invention, which achieves this object, is a sheet-like soft magnetic material formed from a soft magnetic composition formed by mixing at least a flat soft magnetic powder, an acrylic rubber, an epoxy resin, a curing agent for the epoxy resin, and a solvent, wherein:

the flat soft magnetic powder is arranged in an in-plane direction of the sheet-like soft magnetic material;

the acrylic rubber has a glycidyl group; and a weight ratio of the flat soft magnetic powder with respect to the total amount of the acrylic rubber, the epoxy resin, and the curing agent for the epoxy resin is in the range of from 3.7 to 5.8.

Here, a preferable embodiment of the sheet-like soft magnetic material of the present invention is an embodiment in which an Fe—Si—Cr—Ni alloy powder and/or an Fe—Si—Al alloy powder is(are) used as the flat soft magnetic powder. Furthermore, another preferable embodiment is an embodiment in which a curing agent is used which exhibits latency as the curing agent for the epoxy resin. Still other preferable embodiments are embodiments in which the sheet-like soft magnetic material has no rolling history, a tensile strength is in the range of from 20 MPa or more to 50 MPa or less, or a glossiness at an incident angle of 60° is in the range of from 20% or more to 50% or less.

Furthermore, the present invention provides a method for producing a sheet-like soft magnetic material, comprising: applying and drying a soft magnetic composition, which is formed by mixing at least a flat soft magnetic powder, an acrylic rubber having a glycidyl group, an epoxy resin, a curing agent for the epoxy resin, and a solvent, to a release substrate at a temperature at which a curing reaction essentially does not proceed to produce a curable soft magnetic sheet; obtaining a laminate by laminating two or more of the produced curable soft magnetic sheets; and compressing the laminate at a temperature at which a curing reaction occurs without rolling the laminate.

Advantages of the Invention

The sheet-like soft magnetic material of the present invention is formed from a soft magnetic composition comprising a flat soft magnetic powder, an acrylic rubber having a glycidyl group, an epoxy resin, a curing agent for the epoxy resin, and a solvent. Here, since the acrylic rubber having a glycidyl group reacts with the epoxy resin, the cohesive force of the molecules constituting the sheet-like soft magnetic material can be considerably increased. Furthermore, the acrylic rubber and epoxy resin used as a binder also have excellent heat resistance and humidity resistance. Therefore, the sheet-like soft magnetic material of the present invention can realize good dimensional stability over a long period of time even under a high-temperature, high-humidity environment. Furthermore, since the flat soft magnetic powder is arranged in an in-plane direction of the sheet-like soft magnetic material, magnetic properties are good.

BEST MODE FOR CARRYING OUT THE INVENTION

The sheet-like soft magnetic material of the present invention is formed from a soft magnetic composition formed by mixing at least a flat soft magnetic powder, an acrylic rubber, an epoxy resin, a curing agent for the epoxy resin, and a solvent.

In the present invention, a flat powder (flat soft magnetic powder) is used for the soft magnetic powder. By arranging the flat soft magnetic powder in a two-dimensional in-plane direction, high magnetic permeability and a large specific gravity can be realized.

An arbitrary soft magnetic alloy may be used as the raw material of the flat soft magnetic powder. Examples thereof include magnetic stainless steel (Fe—Cr—Al—Si alloy), sendust (Fe—Si—Al alloy), permalloy (Fe—Ni alloy), copper silicate (Fe—Cu—Si alloy), Fe—Si alloy, Fe—Si—B (—Cu—Nb) alloy, Fe—Si—Cr—Ni alloy, Fe—Si—Cr alloy, Fe—Si—Al—Ni—Cr alloy, ferrite and the like. Among these, from the perspective of magnetic properties, Fe—Si—Al alloy or Fe—Si—Cr—Ni alloy may be preferably used.

Concerning these soft magnetic alloys, when used for RFID communication, it is preferred to use an alloy whose numerical value for the real part of the complex relative magnetic permeability (magnetic permeability) $\mu'$ is relatively large, and numerical value for the imaginary part of the complex relative magnetic permeability (magnetic loss) $\mu''$ is relatively small. As a result, the magnetic field emitted from an antenna coil for RFID communication is prevented from being converted into an eddy-current loss by a metallic body, so that communication performance is improved.

Furthermore, as the flat soft magnetic alloy, preferred is an alloy with a relatively large resistance in order to reduce the value of $\mu''$ to reduce eddy-current loss. In this case, the resistance can be increased by changing the composition of the soft magnetic alloy. For example, for an Fe—Si—Cr alloy or an Fe—Si—Al alloy, it is preferred to have an Si proportion of from 9 to 15 wt. %.

As the flat soft magnetic powder, while a flat-shaped soft magnetic powder may be used, preferred is to have an average particle size of from 3.5 to 100 μm and an average thickness of from 0.3 to 3.0 μm, and more preferred is to have an average particle size of from 10 to 100 μm and an average thickness of from 0.5 to 2.5 μm. Therefore, the flatness (flatness degree) is preferably set to the range of from 8 to 80, and more preferably to the range of from 15 to 65. Here, the flatness is a numerical value calculated by multiplying the numerical value ($cm^2/g$) of the below-described specific surface area by the numerical value (μm) of the 50% particle size (D50). To uniform the sizes of the flat soft magnetic powder particles, a sieve or the like may optionally be used for classification. Furthermore, to increase magnetic permeability of the soft magnetic material, it is effective to increase the particle size of the flat soft magnetic powder so as to reduce the gaps between the particles, and to increase the aspect ratio of the flat soft magnetic powder to reduce the effect of the demagnetizing field in the soft magnetic sheet.

The tap density of the flat soft magnetic powder (JIS K-5101) and the specific surface area (BET method) are inversely proportional to each other. However, if the specific surface area is too large, not only does the value of $\mu'$ increase, but the value of $\mu''$, which is preferably not increased, tends to become too large. Conversely, if the specific surface area is too small, the value of $\mu'$ tends to become too small. Furthermore, if the tap density is too small, it becomes difficult to apply the coating composition of the soft magnetic powder even if a large amount of solvent is used, while if the tap density is too large, $\mu$ tends to decrease. Therefore, the ranges of these numerical values are set in a preferable range. Specifically, the tap density is preferably set to the range of from 0.55 to 1.45 g/mL, and more preferably to the range of from 0.65 to 1.40 g/mL, while the specific surface area is preferably set to the range of from 0.40 to 1.20 $m^2/g$, and more preferably to the range of from 0.65 to 1.00 $m^2/g$.

Furthermore, as the flat soft magnetic powder, for example, a soft magnetic powder which has undergone a coupling treatment using a coupling agent such as a silane coupling agent may be used. By using a soft magnetic powder which has undergone a coupling treatment, the reinforcing effect at the interface between the flat soft magnetic powder and the binder is increased, whereby specific gravity and corrosion resistance can be improved. Examples of coupling agents which may be used include γ-methacryloxypropyltrimethoxysilane, γ-glycidyloxypropyltrimethoxysilane, γ-glycidyloxypropylmethyldiethoxysilane and the like. Furthermore, this coupling treatment may be carried out in advance on the soft magnetic powder, or may be carried out by simultaneously mixing the coupling agent when mixing the flat soft magnetic powder and the binder resin.

If the used amount of the flat soft magnetic powder in the soft magnetic composition is too low, the intended magnetic properties cannot be obtained, while if the used amount is too much, the binder resin content becomes relatively low, so that moldability deteriorates. Thus, the used amount is preferably in the range of from 70 to 90 wt. % of the soft magnetic composition excluding the solvent, and more preferably the range of from 80 to 85 wt. %.

To impart good flexibility and heat resistance to the sheet-like magnetic material, the soft magnetic composition uses an acrylic rubber as the rubber component. This acrylic rubber has at least one glycidyl group to improve reactivity with the epoxy resin. Furthermore, the acrylic rubber preferably also has a hydroxy group so that adhesion when laminating a plurality of the thin soft magnetic sheets can be improved. This acrylic rubber preferably has a number average molecular weight of from 50,000 to 300,000 and a weight average molecular weight of from 100,000 to 450,000. Furthermore, the glass transition temperature is preferably in the range of from −10 to 15° C. Solution viscosity is preferably in the range of from 1,500 to 15,000 mPa·s (25° C.). The hydroxyl value is preferably 6 to 10 mg KOH/g. Specific examples of such an acrylic rubber include EA-AN, BA-EA-AN, BA-MMA, and BA-AN.

If the used amount of the acrylic rubber in the soft magnetic composition is too low, flexibility decreases, while if the used amount is too much, rubber elasticity increases and compressibility deteriorates (hot workability decreases). Thus, the used amount is preferably 9 to 16 wt. % of the soft magnetic composition excluding the solvent, and is more preferably 12 to 14 wt. %.

To impart good hot workability and dimensional stability to the sheet-like soft magnetic material, the soft magnetic composition uses an epoxy resin. An epoxy resin which is conventionally used in soft magnetic sheets may be used as the epoxy resin. Specific examples thereof include phenol novolac, tetraglycidyl phenol, O-cresol novolac, tetraglycidyl amine, bisphenol A, bis A glycidyl ether, and bisphenol F. The epoxy resin has an epoxy equivalent of from 180 to 220 g/eq.

If the used amount of the epoxy resin in the soft magnetic composition is too low, sufficient hot workability cannot be obtained, while if the used amount is too much, flexibility is harmed. Thus, the used amount is preferably in the range of from 1.0 to 6.0 wt. % of the soft magnetic composition excluding the solvent, and is more preferably in the range of from 1.5 to 4.0 wt. %.

To cure the epoxy resin, the soft magnetic composition uses a curing agent for the epoxy resin. A curing agent for epoxy resins which is conventionally used in soft magnetic sheets may be used as the curing agent for the epoxy resin. Specific examples thereof include an amine, imidazole, polyamide, phenolic anhydride and the like. These curing agents are preferably latent.

If the used amount of the curing agent for the epoxy resin in the soft magnetic composition is too low, product reliability deteriorates (storability deteriorates), while if the used amount is too much, this may cause the coating composition life to deteriorate, the coating sheet life to deteriorate, and costs to increase. Thus, the used amount is preferably in the range of from 3 to 100 parts by weight based on 100 parts by weight of the epoxy resin, and more preferably in the range of from 10 to 40 parts by weight.

As the solvent, a common multipurpose solvent may be used. Examples of multipurpose solvents which can be used include alcohols such as ethanol, n-propanol, isopropyl alcohol (IPA), and n-butyl alcohol, esters such as ethyl acetate and n-butyl acetate, ketones such as acetone, methyl ethyl ketone (MEK), methyl isobutyl ketone (MIBK), and cyclohexanone, ethers such as tetrahydrofuran (THF), cellosolves such as ethyl cellosolve, n-butyl cellosolve, and cellosolve acetate, and aromatic hydrocarbons such as toluene, xylene, and benzene. The used amount of such solvent may be appropriately selected based on the kind of composition of the soft magnetic composition, the coating method and the like.

Furthermore, the weight ratio of the flat soft magnetic powder with respect to the total amount of the acrylic rubber, the epoxy resin, and the curing agent for the epoxy resin is in the range of from 3.7 to 5.8, and preferably in the range of from 4.0 to 5.3. This is because if this weight ratio is less than 3.7, $\mu'$ does not sufficiently increase, while if the weight ratio is more than 5.8, unevenness in the thickness on the coating surface occurs due to a lack of binder component, hot workability decreases, and streaks form during the coating. Furthermore, if the amount of the acrylic rubber is increased with respect to the amount of the epoxy resin, the sheet-like soft magnetic material becomes softer, while if the amount of the epoxy resin is increased, the sheet-like soft magnetic material conversely becomes harder. Therefore, if a relatively large amount of the epoxy resin is used with respect to the acrylic rubber, a high-reliability sheet-like soft magnetic material can be obtained.

Furthermore, the production of the soft magnetic composition can be carried out by uniformly mixing the above-described components by an ordinary method.

Furthermore, in the sheet-like soft magnetic material of the present invention, the flat soft magnetic powder is arranged in an in-plane direction of the sheet-like soft magnetic material. As a result, magnetic properties are improved and the specific gravity can be increased. Aligning in an in-plane direction can be achieved by compressing a curable soft magnetic sheet (including cases where two or more layers are laminated) obtained by applying the above-described soft magnetic composition to a release substrate when producing the sheet-like soft magnetic material from the soft magnetic composition. In this case, although compressing is performed, the compressing is carried out without extending in a two-dimensional direction, that is, without rolling. Specifically, the compressing is carried out so that the linear elongation percentage in a planar direction is not greater than 1%. This is because if the curable soft magnetic sheet is rolled with a linear elongation percentage of more than 1%, unevenness occurs in the thickness, and unevenness also occurs in $\mu'$ and the specific gravity. In addition, defects such as wrinkles and cracks are formed, the filling of the soft magnetic powder is insufficient, and orientation defects occur, whereby $\mu'$ fails to increase.

If the tensile strength of the sheet-like soft magnetic material of the present invention is too small, compression is insufficient, and the soft magnetic powder is not densely packed, which can result in air entering the sheet interior and the thickness changes increasing. Conversely, if the tensile strength is too large, the sheet is compressed too much, whereby the sheet becomes hard, which can harm the flexibility. Therefore, the tensile strength is preferably in the range of from 20 MPa or more to 50 MPa or less, and more preferably in the range of from 25 MPa or more to 45 MPa or less. Thus, if the tensile strength is in this range, there is the advantageous effect that there is no reduction in the yield when incorporating the sheet-like soft magnetic material in an electronic device and the like since the sheet itself has a certain hardness while also having a suitable flexibility, excellent workability, and handleability. The tensile strength can be set in this range by adjusting the pressing pressure and the blending amounts in the soft magnetic powder. Furthermore, measurement of the tensile strength may be carried out by a well-known method.

If the glossiness of the sheet-like soft magnetic material of the present invention is too low, the soft magnetic powder may not only fall off from the sheet sides, but also from the sheet surface. Furthermore, since the sheet is not sufficiently compressed, air enters into the sheet interior, moisture tends to infiltrate into the sheet, and the sheet thickness becomes thicker under a high-temperature or high-temperature, high-humidity environment, which can cause the magnetic properties to deteriorate. Conversely, if the glossiness is too large, while the sheet is sufficiently compressed and the surface is smooth, the sheet becomes hard. Therefore, the glossiness at an incident angle of 600 is preferably in the range of from 20% or more to 50% or less, and more preferably in the range of from 23% or more to 48% or less. Thus, if the glossiness is in this range, the advantageous effects that the thickness change and change in the magnetic properties can be reduced even under a high-temperature, high-humidity environment while keeping flexibility in the sheet can be obtained. The glossiness can be set in this range, for example, through selection of the kind of cushioning material used during pressing, and adjustment of the size of indented portions and the pressure magnitude. Measurement of the glossiness can be carried out according to JIS Z8741 or JIS P8142.

If the linear expansion coefficient of the sheet-like soft magnetic material of the present invention is too high, the sheet tends to become too soft, while if the linear expansion coefficient is too low, the sheet tends to become too hard. Thus, the linear expansion coefficient is preferably in the range of from 15 to 22 ppm/° C., and more preferably in the range of from 16 to 21 ppm/° C. Furthermore, the difference in linear expansion coefficients between the adherend and the sheet-like soft magnetic material is preferably 10 ppm/° C. or less. As a result, both of the linear expansion coefficients can be made approximately the same, so that release can be made more difficult even if heating and cooling are repeated. For example, if an antenna and the sheet-like soft magnetic material are laminated using an adhesive, the occurrence of release problems can be largely suppressed, and good planarity can be realized. Furthermore, since the hygroscopicity of the sheet-like soft magnetic material composed of the acrylic rubber, epoxy resin, and latent curing agent is low, the occurrence of corrosion can be prevented even if the sheet-like soft magnetic material of the present invention is adhered to a conductor which is an adherend.

Next, a preferred example of the method for producing the sheet-like soft magnetic material of the present invention will be described. This production method produces a sheet-like soft magnetic material by applying and drying a soft magnetic composition, which is formed by mixing at least a flat soft magnetic powder, an acrylic rubber having a glycidyl group, an epoxy resin, a curing agent for the epoxy resin, and a solvent, to a release substrate at a temperature at which a curing reaction essentially does not proceed to produce a curable soft magnetic sheet, obtaining a laminate by laminating two or more of the produced curable soft magnetic sheets, and compressing the laminate at a temperature at which a curing reaction occurs without rolling the laminate.

In this production method, first, a curable soft magnetic sheet is obtained by applying and drying a soft magnetic composition to a release substrate at a temperature at which a curing reaction essentially does not proceed. The soft magnetic composition can be applied to the release substrate by utilizing a well-known method such as a doctor blade coating method, a comma coater coating method and the like. Although the coating thickness may be appropriately determined based on the application of the sheet-like soft magnetic material and the number of laminated layers, usually coating is carried out so that the dry thickness is in the range of from 50 to 200 μm. If the coating is carried out to a thickness of more than 200 μm, drying becomes more difficult, and in some cases the sheet swells during drying, and thus care needs to be taken.

The reason for applying and drying at a temperature at which a curing reaction of the soft magnetic composition essentially does not proceed is because if a curing reaction does proceed, compressibility deteriorates, so that μ' does not increase, and because if a soft magnetic composition which has undergone a curing reaction is compressed, the thickness change under a high-temperature, high-humidity environment increases. Here, "curing reaction essentially does not proceed" means that a crosslinking reaction can be uniformly carried out in the final step. Although the specific temperature depends on the composition of the soft magnetic composition, usually, the temperature is 130° C. or less. Specific methods for the drying which may be employed include well-known methods using a hot air drying furnace, an electrically heated furnace, infrared heating and the like.

As the release substrate, a common release substrate may be used. For example, a polyester sheet having a surface which has undergone a silicone release treatment may be used.

Next, two or more curable soft magnetic sheets are prepared and laminated to obtain a laminate. The number of laminated layers is determined based on the application of the sheet-like soft magnetic material and the like. Furthermore, when laminating, it is preferred to provide a release sheet on either side of the soft magnetic sheet laminate. As a release sheet in such a case, a polyester sheet and the like having a surface which has undergone a silicone release treatment may be used. When laminating two or more layers, a pressing machine may be used which integrally applies pressure over the whole of the sheets. In such a case, while glossiness and tensile strength increase if the pressing pressure is too high, the flexibility tends to decrease. Furthermore, instead of a pressing machine, if a laminator which applies a linear pressure is used, the glossiness and the tensile strength tend to decrease.

Next, the thus-obtained laminate is compressed at a temperature at which a curing reaction occurs without rolling the laminate. As a result, a sheet-like soft magnetic material can be obtained in which the sheet thickness change is suppressed and fluctuation in the magnetic permeability are also small.

The reason for compressing so that the laminate does not roll is that, as described above, unevenness occurs in the thickness when performing compressing, and unevenness also occurs in μ' and the specific gravity. Furthermore, defects such as wrinkles and cracks are formed, the filling of the soft magnetic powder is insufficient, and μ' fails to increase due to orientation defects. In addition, the reason for heating at "a temperature at which a curing reaction of the laminate occurs" is to cause the crosslinking to occur in a highly-filled, highly-oriented state. Although the specific temperature depends on the composition of the soft magnetic composition, usually the temperature is in the range of from 100 to 200° C., and preferably in the range of from 140 to 180° C.

As the compressing method, a laminator which applies a linear pressure with two rolls may be used, although from the perspective of suppressing rolling, it is preferred to use a pressing machine having a flat face which is also capable of heating. In such a case, although the value of the compression pressure depends on the material of the curable soft magnetic sheet, the number of laminated layers and the like, the compression pressure is preferably in the range of from 10 to 50 kgf/cm$^2$, and more preferably in the range of from 20 to 40 kgf/cm$^2$. Furthermore, the lamination and compressing may be carried out simultaneously.

EXAMPLES

The present invention will now be described in more detail with reference to the following examples.

Example 1

A soft magnetic composition was obtained by uniformly mixing 500 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 1, 75.5 parts by weight of an acrylic rubber having a glycidyl group (SG80H-3, manufactured by Nagase ChemteX Corporation; weight average molecular weight of 350,000, Tg 7.5° C.), 21 parts by weight of an epoxy resin (Epicoat 1031S, manufactured by Japan Epoxy Resins Co., Ltd.), 6.3 parts by weight of a latent curing agent for the epoxy resin (HX3748, manufactured by Asahi Kasei Chemicals Corporation), 270 parts by weight of toluene, and 120 parts by weight of ethyl acetate. This soft magnetic composition was applied using a coater to a polyester film (release PET) having a surface which had undergone a release treatment. The coated composition was dried at a temperature of less than 80° C., and then dried at 100° C. to obtain a curable soft magnetic sheet with a dried sheet thickness of about 100 μm.

Four of the obtained curable soft magnetic sheets from which the release PET was removed were prepared, and laminated on each other. Both sides of the resultant laminate were sandwiched with a release PET, and then high-quality paper with a thickness of 100 μm was provided either side thereof as a cushioning material. Both sides of this structure were sandwiched with a stainless steel (SUS) plate, and the resultant structure was compressed for 10 minutes at 165° C. at a pressure of 24.9 kgf/cm$^2$ using a vacuum press (manufactured by Kitagawa Seiki Co. Ltd.) to obtain a sheet-like soft magnetic material.

(Evaluation)

When the obtained sheet-like soft magnetic material was subjected to a heat resistance test (left to stand for 96 hours in an oven having a temperature of 85° C. and a humidity of 60 Rh %), the thickness of the after-test sheet-like soft magnetic material became thinner. However, the percentage change was less than 2% based on the sheet-like soft magnetic material before the heat resistance test. Furthermore, the value of the effective magnetic permeability μ was in the range of from 34 or more to less than 38 and the magnetic loss μ" was less than 1.5. The obtained results are shown in Table 1. Furthermore, the weight ratio of the flat soft magnetic powder (magnetic powder/resin component weight ratio) with respect to the total amount of the acrylic rubber, the epoxy resin, and the curing agent for the epoxy resin is also shown in Table 1.

Furthermore, a ring-shape sample with a 7.05 mm outer diameter and a 2.945 mm inner diameter was produced by punching, and a conductor coil was wrapped 5 times therearound. Solder was applied to the terminals. The length from the base of the terminals to below the ring-shape sample was 20 mm. Regarding the effective magnetic permeability μ', the inductance and resistance at a carrier frequency (13.56 MHz) were measured using an impedance analyzer (4294A, Agilent Technologies) to calculate the magnetic permeability. The obtained value is shown in Table 1.

Furthermore, the glossiness at an incident angle of 60° (−60°) of the obtained sheet-like soft magnetic material was measured according to JIS Z8741 or JIS P8142 using a gloss meter (VG 2000, Nippon Denshoku Industries Co., Ltd). The glossiness is preferably in the range of from 20 to 50%. The obtained results are shown in Table 1.

Regarding the tensile strength of the obtained sheet-like soft magnetic material, a sample having a 250 μm thickness, a 25 mm width, and a 100 mm length was measured at a load of 50 kgf at a tension rate of 10 mm/minute using a tensile tester (Tensilon, Orientec Co., Ltd.). The tensile strength is preferably in the range of from 20 to 50 MPa. The obtained results are shown in Table 1.

The electrical resistance of the obtained sheet-like soft magnetic material was measured using an electrical resistance measurement apparatus (Hiresta P MCP HP260, Dia Instruments Co., Ltd.). The electrical resistance is preferably $1 \times 10^4 \Omega$ or more. The obtained results are shown in Table 1.

Furthermore, the presence of fallen powder (the phenomenon where soft magnetic powder falls off and adheres when the sheet is touched) of the obtained sheet-like soft magnetic material was visually observed. The observation results are shown in Table 1. It is preferred that no fallen powder is observed.

Furthermore, regarding the flexibility of the obtained sheet-like soft magnetic material, a 250 mm-square sheet was folded in half and tested. If the sheet broke, the sheet was evaluated as "poor", and if the sheet did not break, the sheet was evaluated as "good". The evaluation results are shown in Table 1. It is preferred that the sheet does not break.

The linear expansion coefficient of the obtained sheet-like soft magnetic material was measured using a heat/stress/deformation measurement apparatus (EXSTA 6000, TMA/SS, SSI NanoTechnology Inc.). The linear expansion coefficient is preferably in the range of from 15 to 22 ppm/° C. The obtained results are shown in Table 1.

The obtained sheet-like soft magnetic material exhibited good results for all of glossiness, tensile strength, electrical resistance, fallen powder, flexibility, and linear expansion coefficient.

Example 2

A soft magnetic composition containing 425 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 1, 80.8 parts by weight of an acrylic rubber having a glycidyl group (SG80H-3, manufactured by Nagase ChemteX Corporation), 22.5 parts by weight of an epoxy resin (Epicoat 1031S, manufactured by Japan Epoxy Resins Co., Ltd.), 6.7 parts by weight of a latent curing agent for the epoxy resin (HX3748, manufactured by Asahi Kasei Chemicals Corporation), 270 parts by weight of toluene, and 120 parts by weight of ethyl acetate was applied using a coater to a release PET. The coated film was dried at a temperature of less than 80° C., and then dried at 100° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 1. These results show that the sheet thickness after the heat resistance test became thinner. However, the percentage change was less than 2%. The value of the magnetic permeability μ' was in the range of from 34 or more to less than 38 and the magnetic loss μ" was less than 1.5. Furthermore, good results were exhibited for all of glossiness, tensile strength, electrical resistance, fallen powder, flexibility, and linear expansion coefficient.

Example 3

A soft magnetic composition containing 450 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 1, 80.8 parts by weight of an acrylic rubber having a glycidyl group (SG80H-3, manufactured by Nagase ChemteX Corporation), 22.5 parts by weight of an epoxy resin (Epicoat 1031S, manufactured by Japan Epoxy Resins Co., Ltd.), 6.7 parts by weight of a latent curing agent for the epoxy resin (HX3748, manufactured by Asahi Kasei Chemicals Corporation), 270 parts by weight of toluene, and 120 parts by weight of ethyl acetate was applied using a coater to a release PET. The coated film was dried at a temperature of less than 80° C., and then dried at 100° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 1. These results show that the sheet thickness after the heat resistance test became thicker. However, the percentage change was less than 1%. The value of the magnetic permeability μ' was in the range of from 38 or more to less than 40 and the magnetic loss μ" was less than 1.5. Good results were exhibited for all of glossiness, tensile strength, electrical resistance, fallen powder, flexibility, and linear expansion coefficient.

Example 4

A soft magnetic composition containing 475 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 1, 80.8 parts by weight of an acrylic rubber having a glycidyl group (SG80H-3, manufactured by Nagase ChemteX Corporation), 22.5 parts by weight of an epoxy resin (Epicoat 1031S, manufactured by Japan Epoxy Resins Co., Ltd.), 6.7 parts by weight of a latent curing agent for the epoxy resin (HX3748, manufactured by Asahi Kasei Chemicals Corporation), 270 parts by weight of toluene, and 120 parts by weight of ethyl acetate was applied using a coater to a release PET. The coated film was dried at a temperature of less than 80° C., and then dried at 100° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 1. These results show that the sheet thickness after the heat resistance test became thinner. However, the percentage change was less than 1%. The value of the magnetic permeability $\mu'$ was in the range of from 38 or more to less than 40 and the magnetic loss $\mu''$ was less than 1.5. Furthermore, good results were exhibited for all of glossiness, tensile strength, electrical resistance, fallen powder, flexibility, and linear expansion coefficient.

Example 5

A soft magnetic composition containing 510 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 1, 80.8 parts by weight of an acrylic rubber having a glycidyl group (SG80H-3, manufactured by Nagase ChemteX Corporation), 22.5 parts by weight of an epoxy resin (Epicoat 1031S, manufactured by Japan Epoxy Resins Co., Ltd.), 6.7 parts by weight of a latent curing agent for the epoxy resin (HX3748, manufactured by Asahi Kasei Chemicals Corporation), 270 parts by weight of toluene, and 120 parts by weight of ethyl acetate was applied using a coater to a release PET. The coated film was dried at a temperature of less than 80° C., and then dried at 100° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 1. These results show that the sheet thickness did not change even after the heat resistance test. The value of the magnetic permeability $\mu'$ was 40 or more and the magnetic loss $\mu''$ was less than 1.5. The obtained results are shown in Table 1. Furthermore, good results were exhibited for all of glossiness, tensile strength, electrical resistance, fallen powder, flexibility, and linear expansion coefficient.

Example 6

A soft magnetic composition containing 530 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 1, 80.8 parts by weight of an acrylic rubber having a glycidyl group (SG80H-3, manufactured by Nagase ChemteX Corporation), 22.5 parts by weight of an epoxy resin (Epicoat 1031S, manufactured by Japan Epoxy Resins Co., Ltd.), 6.7 parts by weight of a latent curing agent for the epoxy resin (HX3748, manufactured by Asahi Kasei Chemicals Corporation), 270 parts by weight of toluene, and 120 parts by weight of ethyl acetate was applied using a coater to a release PET. The coated film was dried at a temperature of less than 80° C., and then dried at 100° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 1. These results show that the sheet thickness after the heat resistance test became thicker. However, the percentage change was less than 1%. The value of the magnetic permeability $\mu'$ was 40 or more and the magnetic loss $\mu''$ was less than 1.5. Furthermore, good results were exhibited for all of glossiness, tensile strength, electrical resistance, fallen powder, flexibility, and linear expansion coefficient.

Example 7

A soft magnetic composition containing 550 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 1, 80.8 parts by weight of an acrylic rubber having a glycidyl group (SG80H-3, manufactured by Nagase ChemteX Corporation), 22.5 parts by weight of an epoxy resin (Epicoat 1031S, manufactured by Japan Epoxy Resins Co., Ltd.), 6.7 parts by weight of a latent curing agent for the epoxy resin (HX3748, manufactured by Asahi Kasei Chemicals Corporation), 270 parts by weight of toluene, and 120 parts by weight of ethyl acetate was applied using a coater to a release PET. The coated film was dried at a temperature of less than 80° C., and then dried at 100° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 1. These results show that the sheet thickness after the heat resistance test became thicker. However, the percentage change was less than 1%. The value of the magnetic permeability $\mu'$ was 40 or more and the magnetic loss $\mu''$ was less than 1.5. Furthermore, good results were exhibited for all of glossiness, tensile strength, electrical resistance, fallen powder, flexibility, and linear expansion coefficient.

Example 8

A soft magnetic composition containing 575 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 1, 80.8 parts by weight of an acrylic rubber having a glycidyl group (SG80H-3, manufactured by Nagase ChemteX Corporation), 22.5 parts by weight of an epoxy resin (Epicoat 1031S, manufactured by Japan Epoxy Resins Co., Ltd.), 6.7 parts by weight of a latent curing agent for the epoxy resin (HX3748, manufactured by Asahi Kasei Chemicals Corporation), 270 parts by weight of toluene, and 120 parts by weight of ethyl acetate was applied using a coater to a release PET. The coated film was dried at a temperature of less than 80° C., and then dried at 100° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 1. These results show that the sheet thickness after the heat resistance test became thicker. However, the percentage change was less than 1%. The value of the magnetic permeability $\mu'$ was 40 or more and the magnetic loss $\mu''$ was less than 1.5. Furthermore, good results were exhibited for all of glossiness, tensile strength, electrical resistance, fallen powder, flexibility, and linear expansion coefficient.

Example 9

A soft magnetic composition containing 600 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 1, 80.8 parts by weight of an acrylic rubber having a glycidyl group (SG80H-3, manufactured by Nagase ChemteX Corporation), 22.5 parts by weight of an epoxy resin (Epicoat 1031S, manufactured by Japan Epoxy Resins Co., Ltd.), 6.7 parts by weight of a latent curing agent for the epoxy resin (HX3748, manufactured by Asahi Kasei Chemicals Corporation), 270 parts by weight of toluene, and 120 parts by weight of ethyl acetate was applied using a coater to a release PET. The coated film was dried at a temperature of less than 80° C., and then dried at 100° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 1. These results show that the sheet thickness after the heat resistance test became thicker. However, the percentage change was less than 2%. The value of the magnetic permeability $\mu'$ was in the range of from 38 or more to less than 40 and the magnetic loss $\mu''$ was less than 1.5. Furthermore, good results were exhibited for all of glossiness, tensile strength, electrical resistance, fallen powder, flexibility, and linear expansion coefficient.

Example 10

A curable soft magnetic sheet with a dried sheet thickness of about 100 μm was obtained by repeating the same procedures of Example 5, except that, as the flat soft magnetic powder, a flat soft magnetic powder Fe—Si—Cr—Ni (manufactured by Jemco Co., Ltd.) which exhibited a specific surface area, tap density, 10% particle size, 50% particle size, 90% particle size, flatness, and coercive force as illustrated in Table 1.

Using the obtained curable soft magnetic sheet, the same sheet-like soft magnetic material as in Example 1 was obtained, and evaluated in the same manner as in Example 1. The obtained results are shown in Table 1. These results show that the sheet thickness after the heat resistance test became thicker. However, the percentage change was less than 2%. The value of the magnetic permeability $\mu'$ was 40 or more and the magnetic loss $\mu''$ was less than 1.5. Furthermore, good results were exhibited for all of glossiness, tensile strength, electrical resistance, fallen powder, flexibility, and linear expansion coefficient.

Comparative Example 1

A soft magnetic composition containing 500 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 2, 75.5 parts by weight of an acrylic rubber which does not have a glycidyl group (SG700AS, manufactured by Nagase ChemteX Corporation; weight average molecular weight of 350,000, Tg 4.9° C.), 21 parts by weight of an epoxy resin (Epicoat 1031S, manufactured by Japan Epoxy Resins Co., Ltd.), 6.3 parts by weight of a latent curing agent for the epoxy resin (HX3748, manufactured by Asahi Kasei Chemicals Corporation), 270 parts by weight of toluene, and 120 parts by weight of ethyl acetate was applied using a coater to a release PET. The coated film was dried at a temperature of less than 80° C., and then dried at 100° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 2. These results show that the sheet thickness after the heat resistance test became thicker. Furthermore, the percentage change was more than 2%. The value of the magnetic permeability $\mu'$ was less than 34. Furthermore, while good results were exhibited for all of glossiness, tensile strength, electrical resistance, fallen powder, and flexibility, the linear expansion coefficient exceeded 22 ppm/° C.

Comparative Example 2

A soft magnetic composition containing 500 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 2, 77.1 parts by weight of a butyral resin (BL-1, manufactured by Sekisui Chemical Co., Ltd.; weight average molecular weight of 19,000, Tg 66° C.), 25.7 parts by weight of a block isocyanate (Coronate 2507, manufactured by Nippon Polyurethane Industry Co., Ltd.), and 390 parts by weight of MEK (methyl ethyl ketone) was applied using a coater to a release PET. The coated film was dried at a temperature of less than 80° C., and then dried at 115° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 2. These results show that the sheet thickness after the heat resistance test became thicker, and that the percentage change was more than 2%. Furthermore, while good results were exhibited for all of glossiness, tensile strength, electrical resistance, and fallen powder, the linear expansion coefficient exceeded 22 ppm/° C., and the flexibility evaluation was poor.

Comparative Example 3

A soft magnetic composition containing 500 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 2, 77.1 parts by weight of an acetal resin (KS-1, manufactured by Sekisui Chemical Co., Ltd.; weight average molecular weight of 27,000, Tg 107° C.), 25.7 parts by weight of a block isocyanate (Coronate 2507, manufactured by Nippon Polyurethane Industry Co., Ltd.), and 390 parts by weight of MEK was applied using a coater to a release PET. The coated film was dried at a temperature of less than 80° C., and then dried at 115° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 2. These results show that the sheet thickness after the heat resistance test became thicker. Furthermore, the percentage change was more than 2%. The value of the magnetic permeability μ' was less than 34. Furthermore, while good results were exhibited for all of glossiness, tensile strength, electrical resistance, and fallen powder, the linear expansion coefficient exceeded 22 ppm/° C., and the flexibility evaluation was poor.

Comparative Example 4

A soft magnetic composition containing 400 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 2, 80.8 parts by weight of an acrylic rubber having a glycidyl group (SG80H-3, manufactured by Nagase ChemteX Corporation), 22.5 parts by weight of an epoxy resin (Epicoat 1031S, manufactured by Japan Epoxy Resins Co., Ltd.), 6.7 parts by weight of a latent curing agent for the epoxy resin (HX3748, manufactured by Asahi Kasei Chemicals Corporation), 270 parts by weight of toluene, and 120 parts by weight of ethyl acetate was applied using a coater to a release PET. The coated film was dried at a temperature of less than 80° C., and then dried at 100° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 2. These results show that the sheet thickness after the heat resistance test became thicker, and that the percentage change was more than 2%. The value of the magnetic permeability μ' was less than 34. Furthermore, while good results were exhibited for all of glossiness, tensile strength, electrical resistance, fallen powder, and flexibility, the linear expansion coefficient exceeded 22 ppm/° C.

Comparative Example 5

A soft magnetic composition containing 650 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 2, 80.8 parts by weight of an acrylic rubber having a glycidyl group (SG80H-3, manufactured by Nagase ChemteX Corporation), 22.5 parts by weight of an epoxy resin (Epicoat 1031S, manufactured by Japan Epoxy Resins Co., Ltd.), 6.7 parts by weight of a latent curing agent for the epoxy resin (HX3748, manufactured by Asahi Kasei Chemicals Corporation), 270 parts by weight of toluene, and 120 parts by weight of ethyl acetate was applied using a coater to a release PET. The coated film was dried at a temperature of less than 80° C., and then dried at 100° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 2. These results show that the sheet thickness after the heat resistance test became thicker, and that the percentage change was more than 2%. Furthermore, if the amount of the flat soft magnetic powder with respect to the binder exceeds the optimum range, the orientation state worsens due to deteriorating fluidity, so that the value of the magnetic permeability μ' did not increase. Specifically, the value of the magnetic permeability μ' was in the range of from 38 or more to less than 40, and the magnetic loss μ" was less than 1.5. Furthermore, while good results were exhibited for all of tensile strength, electrical resistance, fallen powder, and flexibility, the linear expansion coefficient was below 15 ppm/° C., and the glossiness evaluation was poor.

Comparative Example 6

A soft magnetic composition containing 500 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 2, 80.8 parts by weight of a nitrile butadiene rubber which does not have a glycidyl group (1072J, manufactured by Zeon Corporation; weight average molecular weight of 340,000, Tg −24° C.), 22.5 parts by weight of an epoxy resin (Epicoat 1031S, manufactured by Japan Epoxy Resins Co., Ltd.), 6.7 parts by weight of a latent curing agent for the epoxy resin (HX3748, manufactured by Asahi Kasei Chemicals Corporation), 270 parts by weight of toluene, and 120 parts by weight of ethyl acetate was applied using a coater to a release PET. The coated film was dried at a temperature of less than 80° C., and then dried at 100° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 2. These results show that the sheet thickness after the heat resistance test became thicker, and that the percentage change was more than 2%. Furthermore, if the amount of the flat soft magnetic powder with respect to the binder exceeds the optimum range, the orientation state worsens due to deteriorating fluidity, so that the value of the magnetic permeability μ' did not increase. Specifically, the value of the effective magnetic permeability μ' was less than 34, and the magnetic loss μ" was less than 1.5. Furthermore, while good results were exhibited for all of glossiness, tensile strength, electrical resistance, fallen powder, and flexibility, the linear expansion coefficient was more than 22 ppm/° C.

Comparative Example 7

A soft magnetic composition containing 650 parts by weight of a flat soft magnetic powder Fe—Si—Cr—Ni (manufactured by Mate Co., Ltd.) which exhibited a specific surface area, tap density, 10% particle size, 50% particle size, 90% particle size, flatness, and coercive force as illustrated in Table 2, 80.8 parts by weight of an acrylic resin which does not have a glycidyl group (WS-023, manufactured by Nagase ChemteX Corporation; weight average molecular weight of 500,000, Tg 15° C.), 22.5 parts by weight of an epoxy resin (Epicoat 1031S, manufactured by Japan Epoxy Resins Co., Ltd.), 6.7 parts by weight of a latent curing agent for the epoxy resin (HX3748, manufactured by Asahi Kasei Chemicals Corporation), 270 parts by weight of toluene, and 120 parts by weight of ethyl acetate was applied using a coater to a release PET. The coated film was dried at a temperature of less than 80° C., and then dried at 100° C. to obtain a curable soft magnetic sheet with a dried sheet thickness of about 100 μm.

Using the obtained curable soft magnetic sheet, the same sheet-like soft magnetic material as in Example 1 was obtained, and evaluated in the same manner as in Example 1. The obtained results are shown in Table 2. These results show that the sheet thickness after the heat resistance test became thicker, and that the percentage change was more than 2%.

Furthermore, if the amount of the flat soft magnetic powder with respect to the binder exceeds the optimum range, the orientation state worsens due to deteriorating fluidity, so that the value of the magnetic permeability $\mu'$ did not increase. Specifically, the value of the magnetic permeability $\mu'$ was less than 34, and the magnetic loss $\mu''$ was less than 1.5. Furthermore, while good results were exhibited for all of glossiness, tensile strength, electrical resistance, fallen powder, and flexibility, the linear expansion coefficient was more than 22 ppm/° C.

TABLE 1

| | Example | | | | | | | | | |
|---|---|---|---|---|---|---|---|---|---|---|
| | 1 | 2 | 3 | 4 | 5 | 6 | 7 | 8 | 9 | 10 |
| [Magnetic Powder/Resin Component] Ratio | 4.86 | 3.86 | 4.09 | 4.32 | 4.64 | 4.82 | 5 | 5.23 | 5.45 | 4.64 |
| Sheet Thickness Percentage Change (%) | <2 | <2 | <1 | <1 | 0 | <1 | <1 | <1 | <2 | <2 |
| Magnetic Permeability $\mu'$ | 34≦, <38 | 34≦, <38 | 38≦, <40 | 38≦, <40 | 40≦ | 40≦ | 40≦ | 40≦ | 38≦, <40 | 40≦ |
| Magnetic Loss $\mu''$ | <1.5 | <1.5 | <1.5 | <1.5 | <1.5 | <1.5 | <1.5 | <1.5 | <1.5 | <1.5 |
| Glossiness % | 32 | 34 | 34 | 34 | 34 | 33 | 31 | 27 | 23 | 33 |
| Tensile Strength MPa | 32 | 34 | 36 | 35 | 34 | 34 | 31 | 27 | 24 | 36 |
| Electrical Resistance Ω | >1E+6 | >1E+6 | >1E+6 | >1E+6 | >1E+6 | >1E+6 | >1E+6 | >1E+6 | >1E+6 | >1E+6 |
| Fallen Powder | None | None | None | None | None | None | None | None | None | None |
| Flexibility | Good | Good | Good | Good | Good | Good | Good | Good | Good | Good |
| Magnetic Powder Fe—Si—Cr—Ni Specific Surface Area $cm^2/g$ | 0.82 | 0.82 | 0.82 | 0.82 | 0.82 | 0.82 | 0.82 | 0.82 | 0.82 | 1.08 |
| Tap Density g/mL | 0.88 | 0.88 | 0.88 | 0.88 | 0.88 | 0.88 | 0.88 | 0.88 | 0.88 | 0.61 |
| D10% μm | 8.7 | 8.7 | 8.7 | 8.7 | 8.7 | 8.7 | 8.7 | 8.7 | 8.7 | 8.7 |
| D50% μm | 20.9 | 20.9 | 20.9 | 20.9 | 20.9 | 20.9 | 20.9 | 20.9 | 20.9 | 20 |
| D90% μm | 45 | 45 | 45 | 45 | 45 | 45 | 45 | 45 | 45 | 40.4 |
| Flatness % | 17.1 | 17.1 | 17.1 | 17.1 | 17.1 | 17.1 | 17.1 | 17.1 | 17.1 | 21.6 |
| Coercive Force Oe | 4.53 | 4.53 | 4.53 | 4.53 | 4.53 | 4.53 | 4.53 | 4.53 | 4.53 | 4.19 |
| Linear Expansion Coefficient ppm/° C. | 17 | 22 | 18 | 19 | 19 | 18 | 16 | 15 | 15 | 16 |

*1 Weight ratio of the flat soft magnetic powder with respect to the total weight of the acrylic rubber, the epoxy resin, and the latent curing agent for the epoxy resin.

TABLE 2

| | Comparative Example | | | | | | |
|---|---|---|---|---|---|---|---|
| | 1 | 2 | 3 | 4 | 5 | 6 | 7 |
| [Magnetic Powder/Resin Component] Ratio *1 | 4.86 | 4.86 | 4.86 | 3.64 | 5.91 | 4.86 | 4.86 |
| Sheet Thickness Percentage Change (%) | 2≦ | 2≦ | 2≦ | 2≦ | 2≦ | 2≦ | 2≦ |
| Magnetic Permeability $\mu'$ | <34 | (Good) | <34 | <34 | 38≦, <40 | <34 | <34 |
| Magnetic Loss $\mu''$ | — | — | — | — | <1.5 | <1.5 | <1.5 |
| Glossiness % | 32 | 33 | 32 | 35 | 19 | 31 | 32 |
| Tensile Strength MPa | 31 | 38 | 37 | 33 | 21 | 31 | 29 |
| Electrical Resistance Ω | >1E+6 | >1E+6 | >1E+6 | >1E+6 | >1E+6 | >1E+6 | >1E+6 |
| Fallen Powder | None | None | None | None | None | None | None |
| Flexibility | Good | Poor | Poor | Good | Good | Good | Good |
| Magnetic Powder Fe—Si—Cr—Ni Specific Surface Area $cm^2/g$ | 0.82 | 0.82 | 0.82 | 0.82 | 0.82 | 0.82 | 0.82 |
| Tap Density g/mL | 0.88 | 0.88 | 0.88 | 0.88 | 0.88 | 0.88 | 0.88 |
| D10% μm | 8.7 | 8.7 | 8.7 | 8.7 | 8.7 | 8.7 | 8.7 |
| D50% μm | 20.9 | 20.9 | 20.9 | 20.9 | 20.9 | 20.9 | 20.9 |
| D90% μm | 45 | 45 | 45 | 45 | 45 | 45 | 45 |
| Flatness % | 17.1 | 17.1 | 17.1 | 17.1 | 17.1 | 17.1 | 17.1 |
| Coercive Force Oe | 4.53 | 4.53 | 4.53 | 4.53 | 4.53 | 4.53 | 4.53 |
| Linear Expansion Coefficient ppm/° C. | 24 | 23 | 25 | 23 | 13 | 23 | 24 |

*1 Weight ratio of the flat soft magnetic powder with respect to the total weight of the rubber and/or the resin, and the curing agent.

As is clear from Table 1, all of the sheet-like soft magnetic materials of Examples 1 to 9 had a small sheet thickness percentage change and good magnetic properties even after the heat resistance test. Furthermore, for the sheet-like soft magnetic material of Example 10, since the tap density was small, the sheet thickness percentage change was larger than that of Example 5.

in Example 1, and these materials were evaluated in the same manner as in Example 1. The obtained results are shown in Table 3. These results show that while the sheet thickness became thicker after the heat resistance test, the percentage change was less than 2%. Furthermore, good results were shown for all of glossiness, tensile strength, electrical resistance, fallen powder, flexibility, and linear expansion coefficient.

TABLE 3

|  | Example | | | | | | |
| --- | --- | --- | --- | --- | --- | --- | --- |
|  | 12 | 13 | 14 | 15 | 16 | 17 | 18 |
| [Magnetic Powder/Resin Component] Ratio *1 | 5 | 5.23 | 5 | 5 | 5 | 5 | 5 |
| Sheet Thickness Percentage Change (%) | <1 | <2 | <1 | <2 | <2 | <2 | <2 |
| Magnetic Permeability $\mu'$ | 80< | 80< | 65≦, <75 | 110< | 55≦, <65 | 50<, ≦55 | 40<, ≦50 |
| Magnetic Loss $\mu''$ | 20< | 20< | 15≦, <20 | 35< | 11≦, <15 | 9≦, <11 | 5≦, <9 |
| Glossiness % | 48 | 46 | 48 | 43 | 33 | 37 | 35 |
| Tensile Strength MPa | 38 | 35 | 38 | 33 | 34 | 36 | 37 |
| Electrical Resistance Ω | >1E+5 | >1E+5 | >1E+5 | >1E+5 | >1E+5 | >1E+5 | >1E+5 |
| Fallen Powder | None | None | None | None | None | None | None |
| Flexibility | Good | Good | Good | Good | Good | Good | Good |
| Magnetic Powder Fe—Si—Cr—Ni Specific Surface Area cm$^2$/g | 0.68 | 0.68 | 0.44 | 0.81 | 0.81 | 0.7 | 0.6 |
| Tap Density g/mL | 0.85 | 0.85 | 0.97 | 0.99 | 1.1 | 1.27 | 1.35 |
| D10% μm | 28.7 | 28.7 | 33.9 | 37.1 | 24.3 | 27.8 | 26.8 |
| D50% μm | 62.7 | 62.7 | 73.7 | 86.2 | 48.7 | 54 | 52.9 |
| D90% μm | 123.4 | 123.4 | 148 | 141 | 95.7 | 104.1 | 102.1 |
| Flatness % | 42.6 | 42.6 | 32.4 | 69.8 | 29.4 | 37.8 | 31.7 |
| Coercive Force Oe | 1.18 | 1.18 | 1.33 | 1.21 | 1.97 | 1.18 | 1.25 |
| Linear Expansion Coefficient ppm/° C. | 16 | 15 | 16 | 16 | 17 | 17 | 18 |

*1 Weight ratio of the flat soft magnetic powder with respect to the total weight of the acrylic rubber, the epoxy resin, and the latent curing agent for the epoxy resin.

In contrast, as is clear from Table 2, in Comparative Examples 1 and 7, the acrylic rubber which does not have a glycidyl group has a poor compatibility with the epoxy resin. Furthermore, because the rubber elasticity is large and compressibility is insufficient, the thickness change is also large. In Comparative Example 2, since a butyral resin is used, there is no flexibility, so that the cured product could not be processed. In Comparative Example 3, since an acetal resin having a high Tg is used, the processability is poor and the thickness change is also large. Furthermore, in Comparative Example 4, since the amount of flat soft magnetic powder is small compared with the amount of binder, the thickness contraction increases. In Comparative Example 5, since the amount of flat soft magnetic powder is large and the orientation of the flat soft magnetic powder deteriorates, μ' decreases and the number of gaps increases, so that the thickness change increases. Furthermore, in Comparative Example 6, since a nitrile butadiene rubber is used, the change toward an increased thickness increased.

Examples 12 to 18

A curable soft magnetic sheet with a dried sheet thickness of about 100 μm was obtained by repeating the operations of Example 7 in the case of Examples 12, and 14 to 18, and the operations of Example 8 in the case of Example 13, except for using the flat soft magnetic powder Fe—Si—Al (manufactured by Mate Co., Ltd.) which exhibited a specific surface area, tap density, 10% particle size, 50% particle size, 90% particle size, flatness, and coercive force as illustrated in Table 3.

Using the obtained curable soft magnetic sheets, sheet-like soft magnetic materials were obtained in the same manner as As can be seen from Table 3, the sheet-like soft magnetic materials of Examples 12 to 18, in which Fe—Si—Al was used as the soft magnetic powder, all had a small sheet thickness percentage change even after the heat resistance test, and the magnetic properties were also good.

Example 19

A curable soft magnetic sheet was obtained by repeating the operations of Example 15. Four of the obtained curable soft magnetic sheets from which the release PET was removed were prepared, and laminated on each other. Both sides of the resultant laminate were sandwiched with a release PET, and then high-quality paper with a thickness of 100 μm was provided either side thereof as a cushioning material. Both sides of this structure were sandwiched with a stainless steel (SUS) plate, and the resultant structure was compressed for 10 minutes while varying the temperature at a pressure of 24.9 kgf/cm$^2$ using a vacuum press (manufactured by Kitagawa Seiki Co. Ltd.) to obtain a sheet-like soft magnetic material. When the obtained sheet-like soft magnetic material was subjected to a heat treatment (left for 96 hours in an oven with a temperature of 85° C. and a humidity of 60 Rh %), the thickness of the sheet-like soft magnetic material after the heat resistance test became thicker. The percentage change is shown in Table 4.

TABLE 4

| | Press Temperature (° C.) | | | | | | | | |
|---|---|---|---|---|---|---|---|---|---|
| | 110 | 120 | 130 | 140 | 150 | 160 | 165 | 175 | 180 |
| Thickness Change (%) | 9 | 6.1 | 4.2 | 3.2 | 3.1 | 2.3 | 1.7 | 1.3 | 1.2 |

From Table 4, it can be seen that under the conditions of the present example, the temperature during pressing is preferably in the range of from 140° C. to 180° C.

INDUSTRIAL APPLICABILITY

The sheet-like soft magnetic material of the present invention is formed from a soft magnetic composition composed of a flat soft magnetic powder, an acrylic rubber having a glycidyl group, an epoxy resin, a curing agent for the epoxy resin, and a solvent. Here, since the acrylic rubber having a glycidyl group reacts with the epoxy resin, the cohesive force of the molecules constituting the sheet-like soft magnetic material can be dramatically increased. Furthermore, the acrylic rubber and epoxy resin used as a binder also have excellent heat resistance and humidity resistance. Therefore, the sheet-like soft magnetic material of the present invention can realize good dimensional stability over a long period of time even under a high-temperature, high-humidity environment. Furthermore, since the flat soft magnetic powder is arranged in an in-plane direction of the sheet-like soft magnetic material, magnetic properties are good. In addition, since the sheet-like soft magnetic material of the present invention uses the acrylic rubber, the epoxy resin, and the curing agent for the epoxy resin as a binder, the sheet-like soft magnetic material has a glossiness after pressing which is different from a metallic glossiness over the whole surface of the sheet, yet can maintain surface glossiness for a long period of time. Therefore, this sheet-like soft magnetic material is useful as a magnetic flux bundle in an RFID system and the like such as a noncontact IC card or an IC tag, or as a common radiowave absorber. Specifically, the present sheet-like soft magnetic material is useful as a flexible shield material for RFID, or as a noise radiowave absorber of an electronic device such as a portable digital camera.

The invention claimed is:

1. A sheet-like soft magnetic material formed from a soft magnetic composition formed by mixing at least a flat soft magnetic powder, an acrylic rubber, an epoxy resin, a curing agent for the epoxy resin, and a solvent, wherein:
    the flat soft magnetic powder is arranged in an in-plane direction of the sheet-like soft magnetic material;
    the acrylic rubber has a glycidyl group; and
    a weight ratio of the flat soft magnetic powder with respect to a total amount of the acrylic rubber, the epoxy resin, and the curing agent for the epoxy resin is in a range of from 3.86 to 5.45.

2. The sheet-like soft magnetic material according to claim 1, wherein the flat soft magnetic powder is an Fe—Si—Cr—Ni alloy powder.

3. The sheet-like soft magnetic material according to claim 1, wherein the flat soft magnetic powder is an Fe—Si—Al alloy powder.

4. The sheet-like soft magnetic material according to claim 1, wherein the curing agent for the epoxy resin exhibits latency.

5. The sheet-like soft magnetic material according to claim 1, wherein a tensile strength is in a range of from 20 MPa or more to 50 MPa or less.

6. The sheet-like soft magnetic material according to claim 1, wherein a glossiness at an incident angle of 60° is in a range of from 20% or more to 50% or less.

7. A method for producing a sheet-like soft magnetic material, comprising:
    applying and drying a soft magnetic composition to a release substrate at a temperature at which a curing reaction essentially does not proceed to produce a curable soft magnetic sheet, where the soft magnetic composition is formed by mixing at least a flat soft magnetic powder, an acrylic rubber having a glycidyl group, an epoxy resin, a curing agent for the epoxy resin, and a solvent, and a weight ratio of the flat soft magnetic powder with respect to a total amount of the acrylic rubber, the epoxy resin, and the curing agent for the epoxy resin is in a range of from 3.86 to 5.45;
    obtaining a laminate by laminating two or more of the produced curable soft magnetic sheets; and
    compressing the laminate at a temperature at which a curing reaction occurs without rolling the laminate.

8. The sheet-like soft magnetic material according to claim 1, wherein the flat soft magnetic powder has a tap density of 0.55 to 1.45 g/mL.

9. A sheet-like soft magnetic material formed from a soft magnetic composition formed by mixing at least a flat soft magnetic powder, an acrylic rubber, an epoxy resin, a curing agent for the epoxy resin, and a solvent, wherein:
    the flat soft magnetic powder is arranged in an in-plane direction of the sheet-like soft magnetic material;
    the acrylic rubber has a glycidyl group;
    a weight ratio of the flat soft magnetic powder with respect to a total amount of the acrylic rubber, the epoxy resin, and the curing agent for the epoxy resin is in a range of from 3.86 to 5.45; and
    a glossiness at an incident angle of 60° is in a range of from 20% or more to 50% or less.

10. The sheet-like soft magnetic material according to claim 9, wherein the flat soft magnetic powder is an Fe—Si—Cr—Ni alloy powder.

11. The sheet-like soft magnetic material according to claim 9, wherein the flat soft magnetic powder is an Fe—Si—Al alloy powder.

12. The sheet-like soft magnetic material according to claim 9, wherein the curing agent for the epoxy resin exhibits latency.

13. The sheet-like soft magnetic material according to claim 9, wherein a tensile strength is in a range of from 20 MPa or more to 50 MPa or less.

14. The sheet-like soft magnetic material according to claim 9, wherein the flat soft magnetic powder has a tap density of 0.55 to 1.45 g/mL.

* * * * *